United States Patent
Kubo

(10) Patent No.: US 11,728,361 B2
(45) Date of Patent: Aug. 15, 2023

(54) IMAGING DEVICE AND MANUFACTURING METHOD THEREOF

(71) Applicant: SONY SEMICONDUCTOR SOLUTIONS CORPORATION, Kanagawa (JP)

(72) Inventor: Norihiro Kubo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 20 days.

(21) Appl. No.: 16/963,817

(22) PCT Filed: Mar. 5, 2019

(86) PCT No.: PCT/JP2019/008598
§ 371 (c)(1),
(2) Date: Jul. 21, 2020

(87) PCT Pub. No.: WO2019/188043
PCT Pub. Date: Oct. 3, 2019

(65) Prior Publication Data
US 2021/0057472 A1 Feb. 25, 2021

(30) Foreign Application Priority Data
Mar. 26, 2018 (JP) .................. 2018-058240

(51) Int. Cl.
*H01L 27/14* (2006.01)
*H01L 27/146* (2006.01)

(52) U.S. Cl.
CPC .. *H01L 27/14623* (2013.01); *H01L 27/14621* (2013.01); *H01L 27/14627* (2013.01);
(Continued)

(58) Field of Classification Search
CPC ......... H01L 27/14623; H01L 27/14638; H01L 27/14643; H01L 27/14689; H01L 27/1464; H01L 27/14645; H01L 27/14621
See application file for complete search history.

(56) References Cited

U.S. PATENT DOCUMENTS 9,324,753 B2 * 4/2016 Kato .................. H01L 27/14689
9,356,061 B2 * 5/2016 Fan ...................... H01L 27/1462
(Continued)

FOREIGN PATENT DOCUMENTS

CN 104637963 A 5/2015
CN 105706240 A 6/2016
(Continued)

OTHER PUBLICATIONS

International Search Report and Written Opinion of PCT Application No. PCT/JP2019/008598, dated Jun. 4, 2019, 11 pages of ISRWO.

*Primary Examiner* — Mounir S Amer
*Assistant Examiner* — Alexander Belousov
(74) *Attorney, Agent, or Firm* — Chip Law Group

(57) ABSTRACT

An imaging device includes a photoelectric converter, a charge holding section that is provided on a side of the photoelectric converter opposite to a light entrance side of the photoelectric converter and holds a signal charge generated by the photoelectric converter, and a light shielding section that has a first light shielding surface extending toward the charge holding section from between the charge holding section and the photoelectric converter.

12 Claims, 15 Drawing Sheets

(52) U.S. Cl.
CPC .. *H01L 27/14645* (2013.01); *H01L 27/14685* (2013.01); *H01L 27/14689* (2013.01)

(56) References Cited

U.S. PATENT DOCUMENTS

| | | | | |
|---|---|---|---|---|
| 9,543,356 | B2* | 1/2017 | Gambino | H01L 27/14689 |
| 9,679,932 | B2* | 6/2017 | Kato | H01L 27/14638 |
| 9,842,875 | B2* | 12/2017 | Fan | H01L 27/1464 |
| 10,002,897 | B2* | 6/2018 | Kato | H01L 27/14627 |
| 10,381,390 | B2* | 8/2019 | Kato | H01L 27/14685 |
| 10,515,988 | B2* | 12/2019 | Tayanaka | H04N 5/2173 |
| 10,714,519 | B2* | 7/2020 | Kato | H01L 27/1464 |
| 10,879,280 | B2* | 12/2020 | Yoshita | H04N 5/369 |
| 10,964,741 | B1* | 3/2021 | Chen | H01L 27/14685 |
| 2010/0230729 | A1* | 9/2010 | Ellis-Monaghan | H01L 27/14609 |
| | | | | 716/30 |
| 2014/0347538 | A1* | 11/2014 | Toda | H01L 27/14605 |
| | | | | 257/292 |
| 2015/0002718 | A1* | 1/2015 | Nomura | H01L 27/1463 |
| | | | | 348/311 |
| 2015/0035028 | A1* | 2/2015 | Fan | H01L 27/14638 |
| | | | | 257/292 |
| 2015/0124139 | A1* | 5/2015 | Ishiwata | H04N 5/36961 |
| | | | | 348/308 |
| 2015/0129943 | A1* | 5/2015 | Kato | H01L 27/14612 |
| | | | | 257/292 |
| 2015/0228693 | A1* | 8/2015 | Toda | H01L 27/14627 |
| | | | | 257/229 |
| 2016/0126266 | A1* | 5/2016 | Kato | H01L 27/14643 |
| | | | | 257/228 |
| 2016/0155774 | A1* | 6/2016 | Hasegawa | H01L 27/14638 |
| | | | | 257/231 |
| 2016/0343756 | A1* | 11/2016 | Fan | H01L 27/1462 |
| 2017/0033143 | A1* | 2/2017 | Toda | H01L 27/14605 |
| 2017/0250210 | A1* | 8/2017 | Kato | H01L 27/14687 |
| 2018/0033809 | A1* | 2/2018 | Tayanaka | H01L 27/14 |
| 2018/0261635 | A1* | 9/2018 | Kato | H01L 27/14643 |
| 2019/0348450 | A1* | 11/2019 | Kato | H01L 27/14623 |
| 2021/0057472 | A1* | 2/2021 | Kubo | H01L 27/14614 |

FOREIGN PATENT DOCUMENTS

| | | |
|---|---|---|
| CN | 107431075 A | 12/2017 |
| CN | 108550599 A | 9/2018 |
| JP | 2013-098446 A | 5/2013 |
| JP | 2015-095468 A | 5/2015 |
| JP | 2016-534557 A | 11/2016 |
| KR | 10-2016-0033231 A | 3/2016 |
| KR | 10-2017-0139687 A | 12/2017 |
| TW | 201515202 A | 4/2015 |
| TW | 201715716 A | 5/2017 |
| WO | 2013/065569 A1 | 5/2013 |
| WO | 2015/020821 A2 | 2/2015 |
| WO | 2016/136486 A1 | 9/2016 |

* cited by examiner

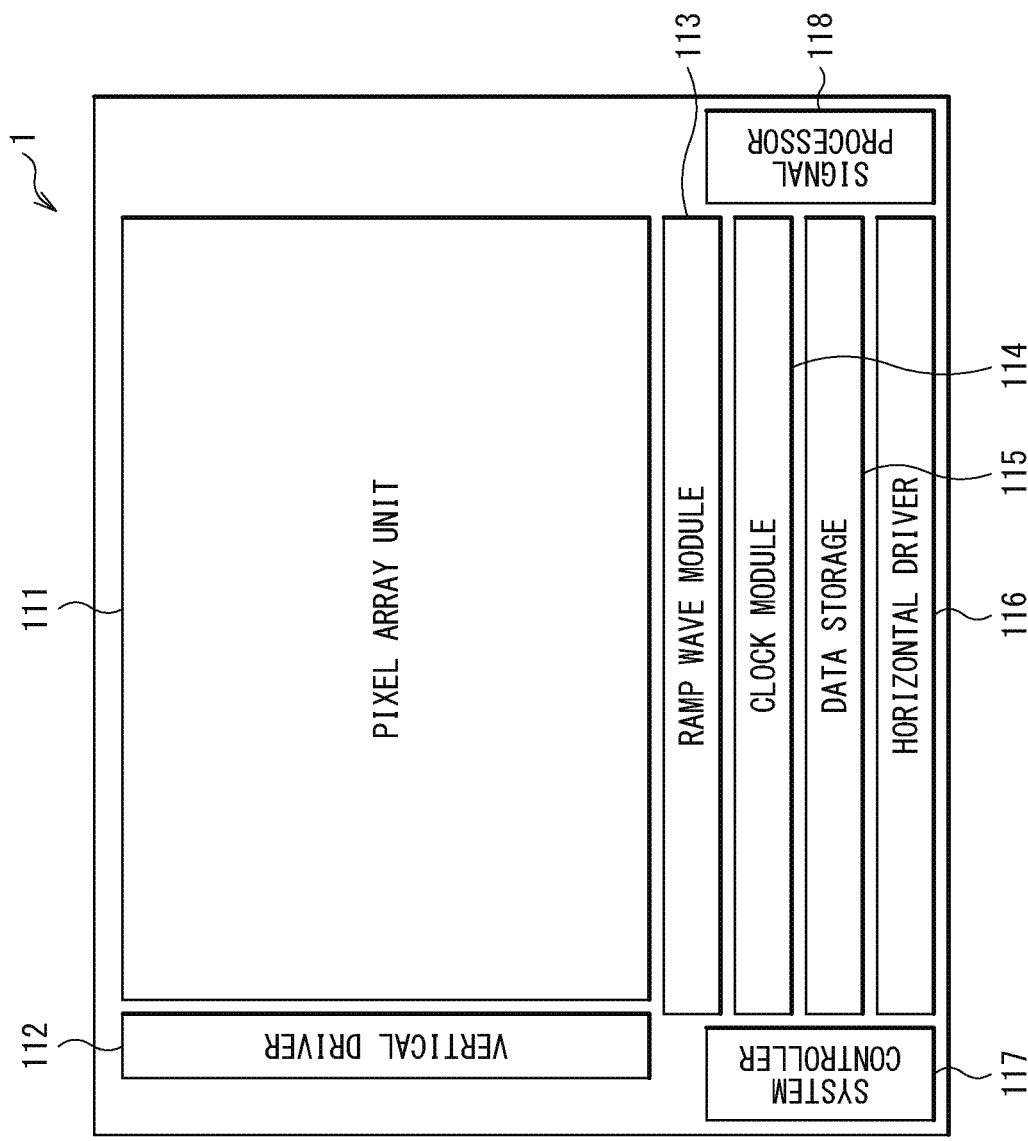
[FIG. 1]

[FIG. 2]
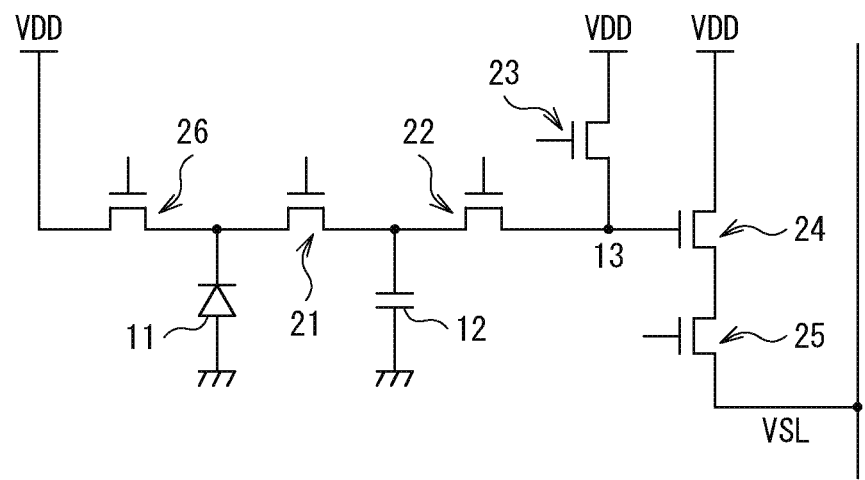

[FIG. 3]
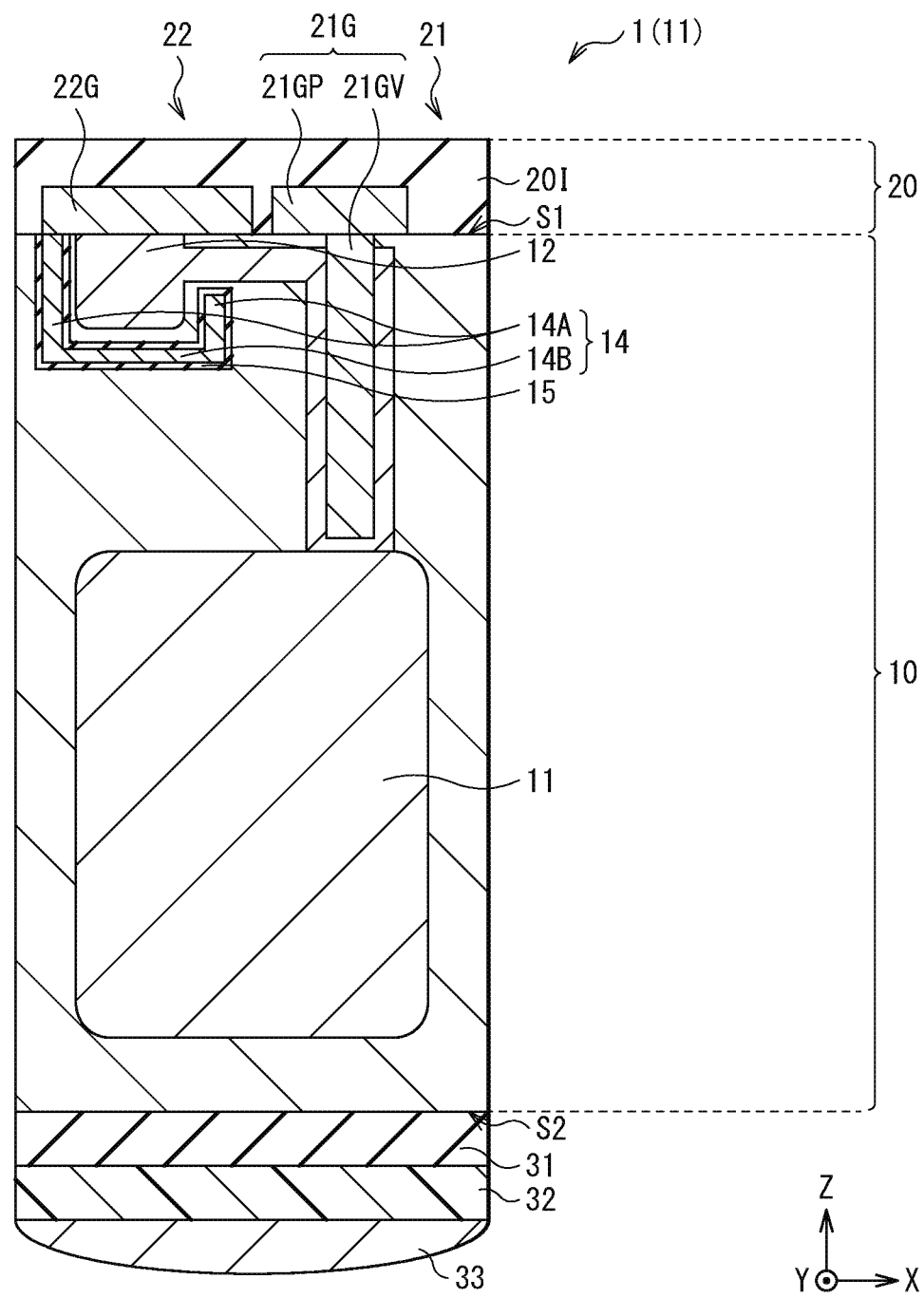

[FIG. 4]
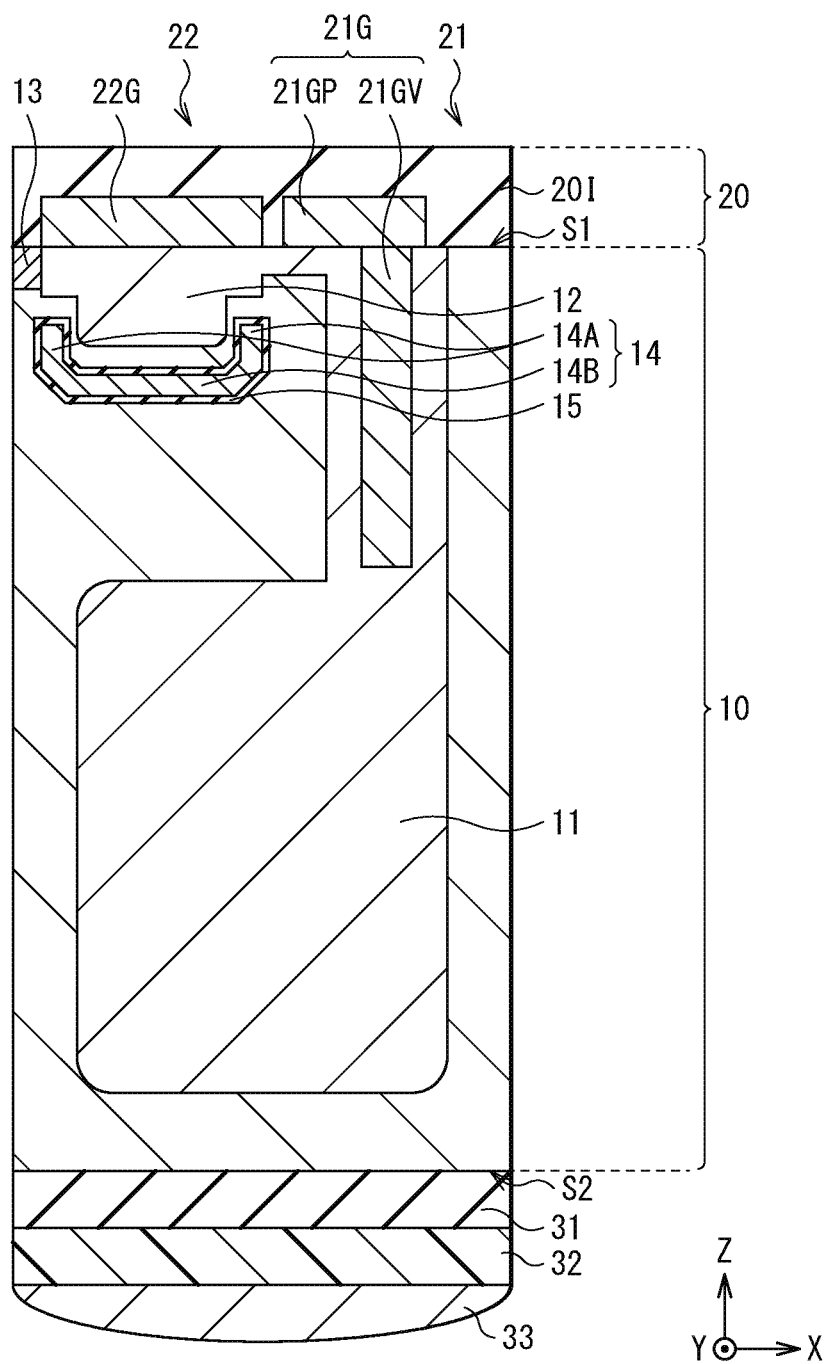

[FIG. 5A]
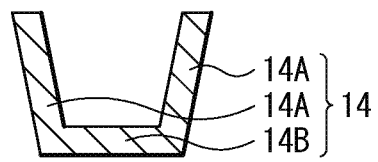
[FIG. 5B]
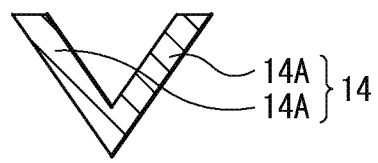
[FIG. 5C]
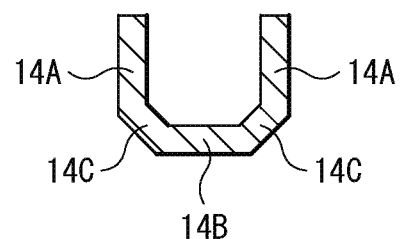
[FIG. 5D]
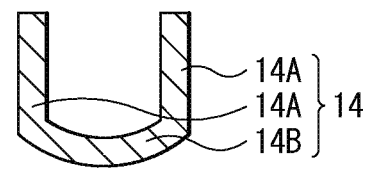

[FIG. 6A]
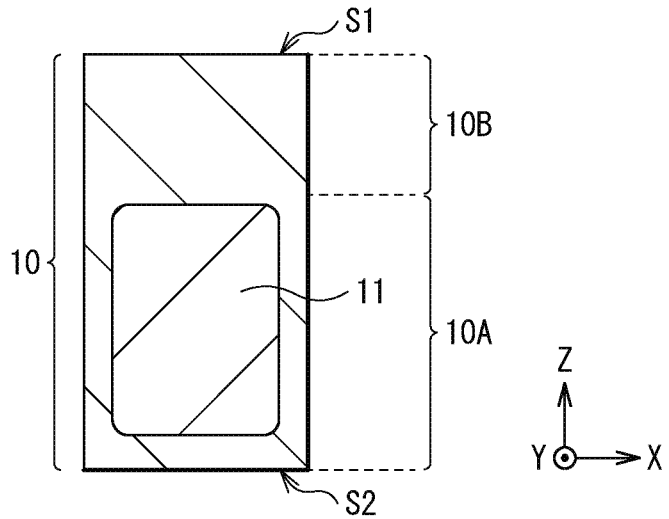
[FIG. 6B]
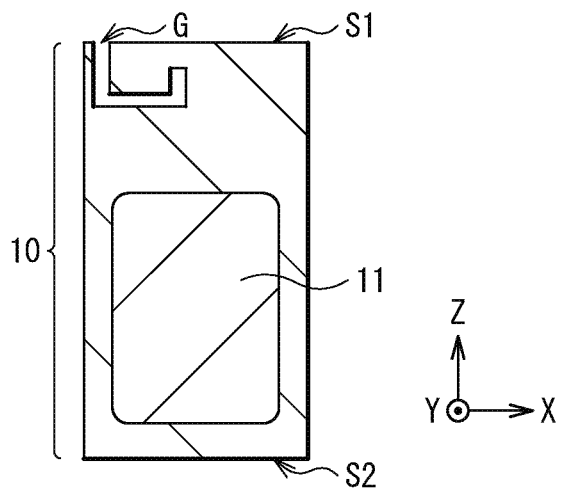
[FIG. 6C]
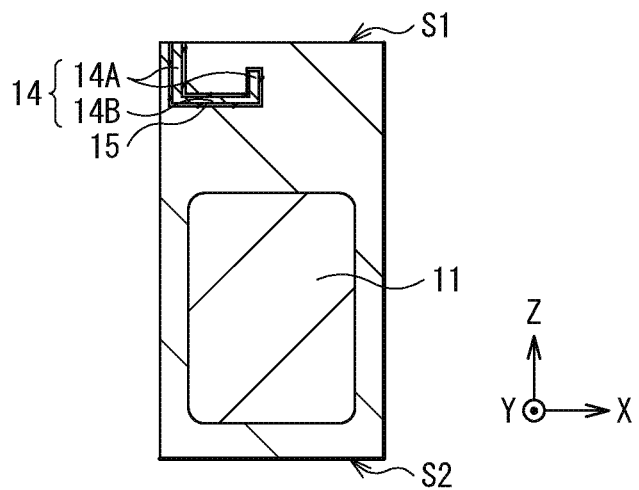

[FIG. 6D]
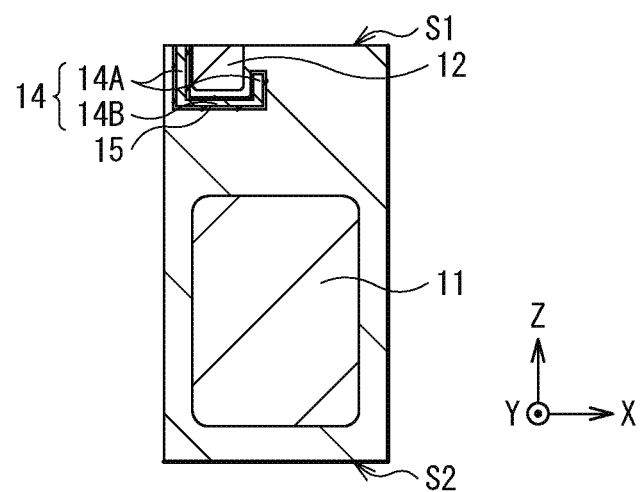
[FIG. 6E]
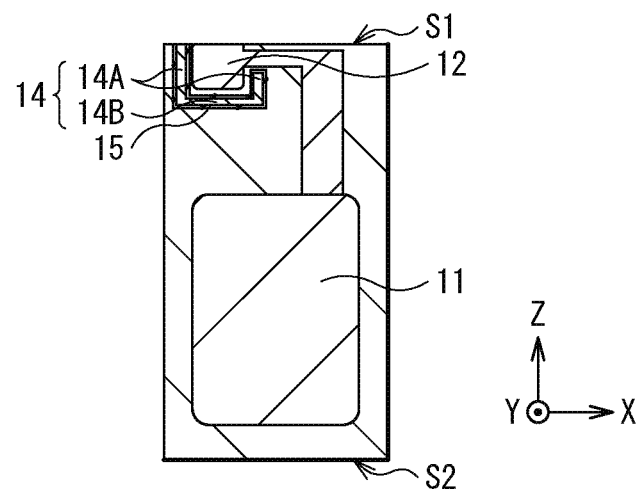

[FIG. 7A]
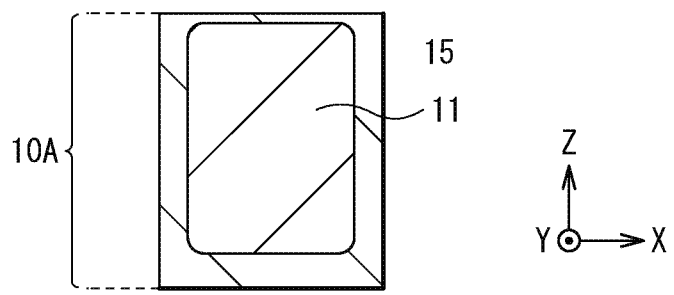
[FIG. 7B]
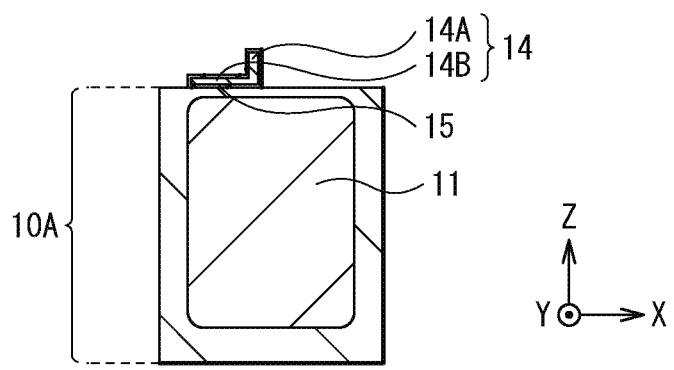
[FIG. 7C]
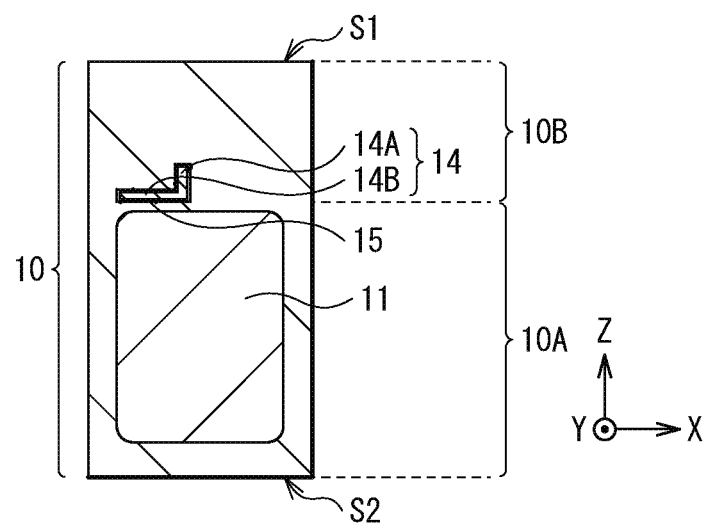

[FIG. 7D]
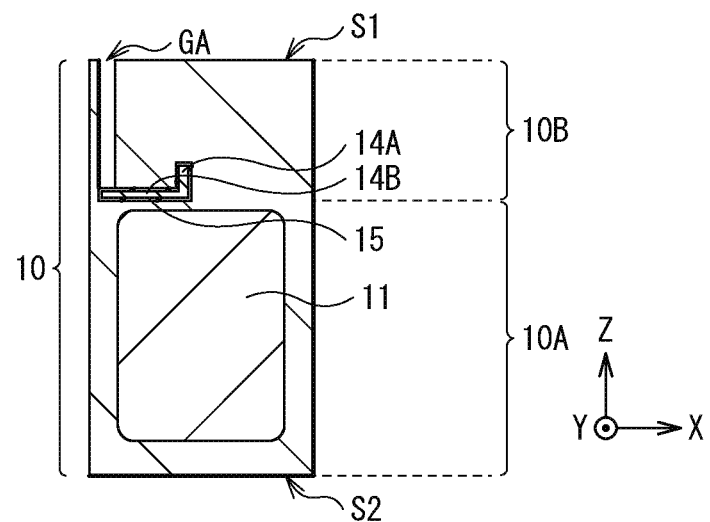
[FIG. 7E]
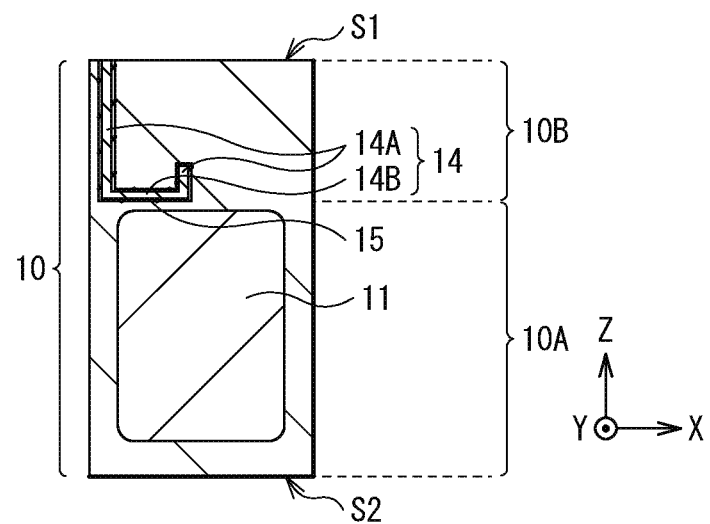

[FIG. 8A]
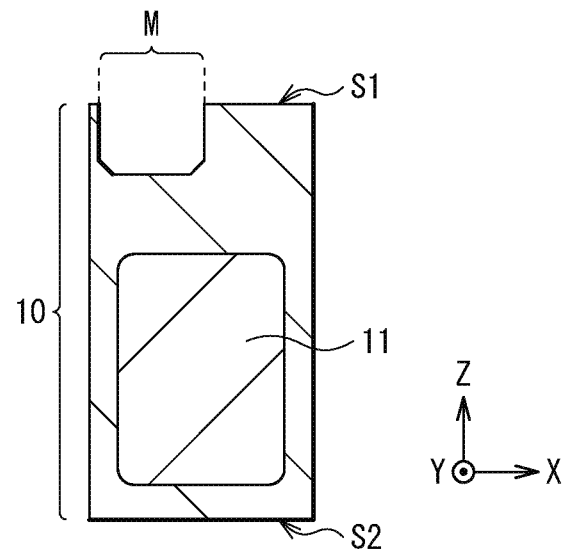
[FIG. 8B]
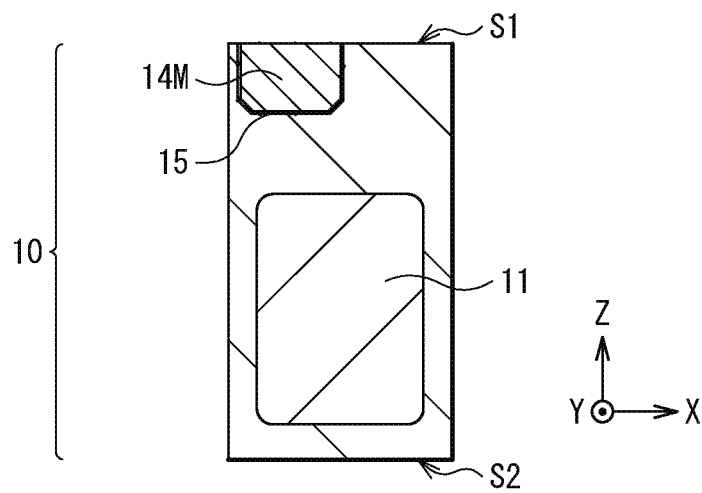
[FIG. 8C]
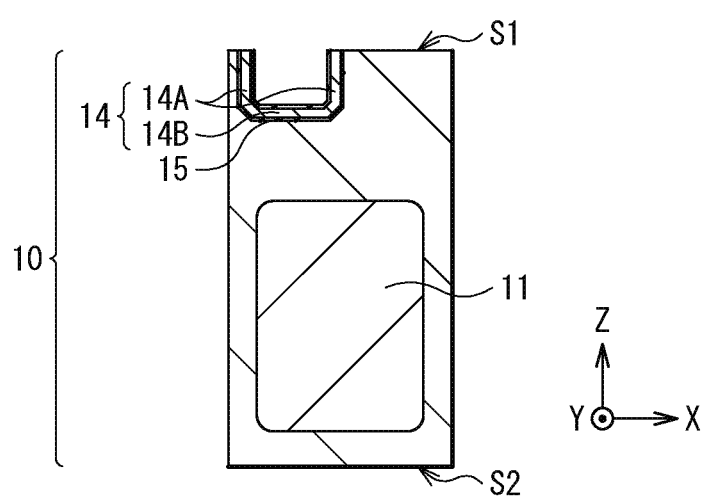

[FIG. 8D]
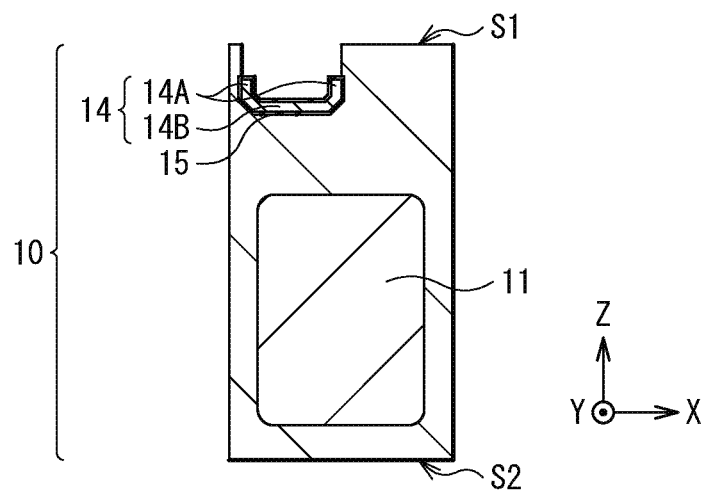
[FIG. 8E]
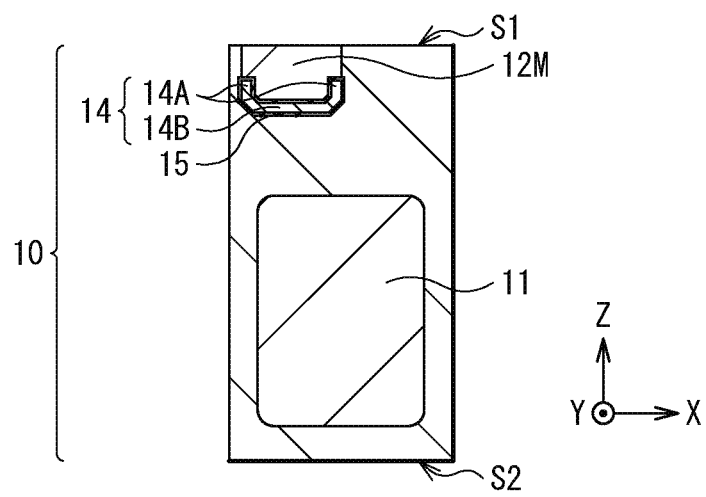

[FIG. 9]
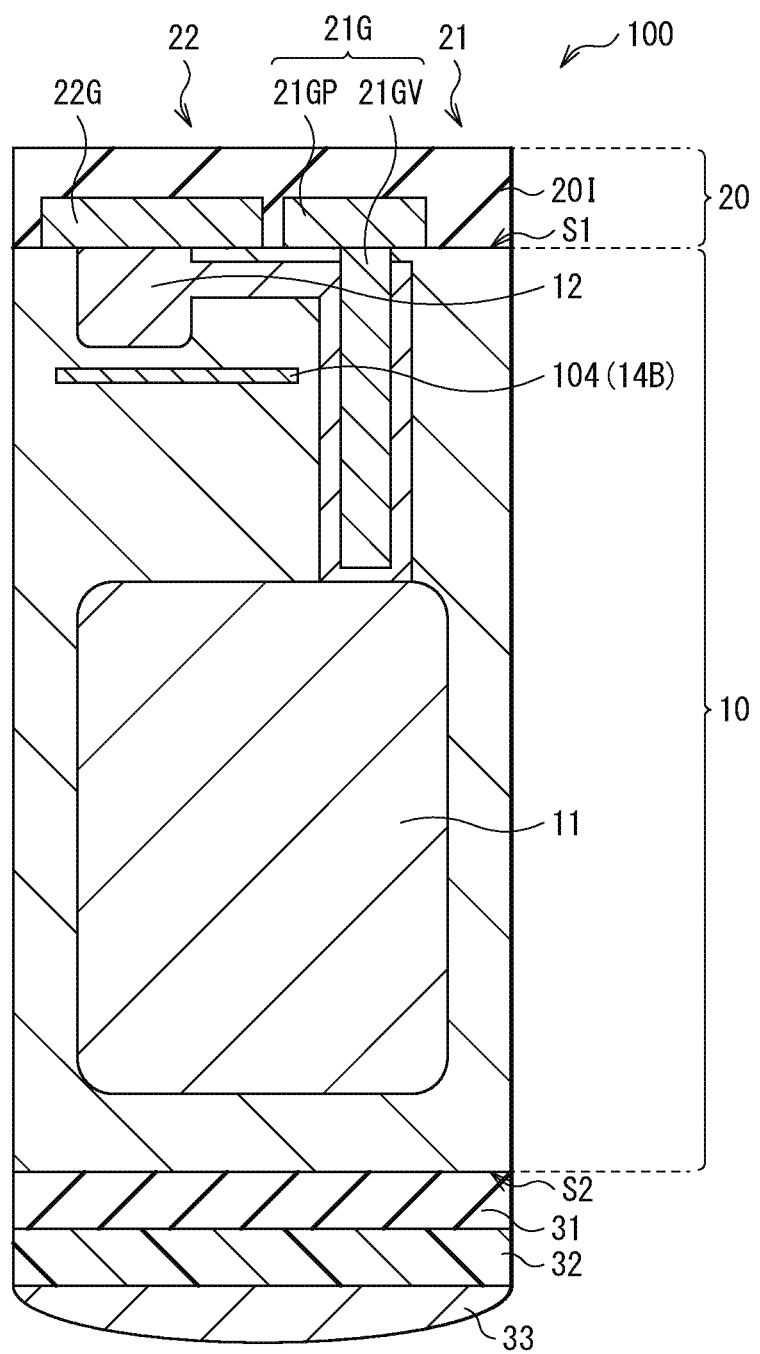

[FIG. 10]
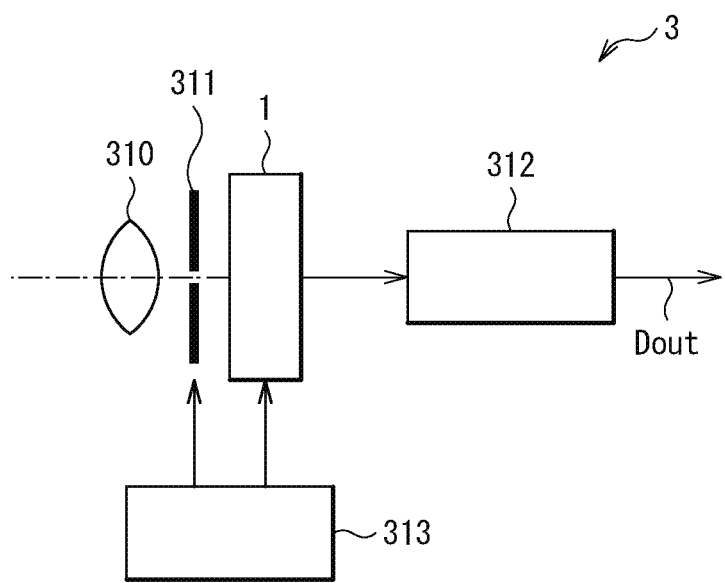

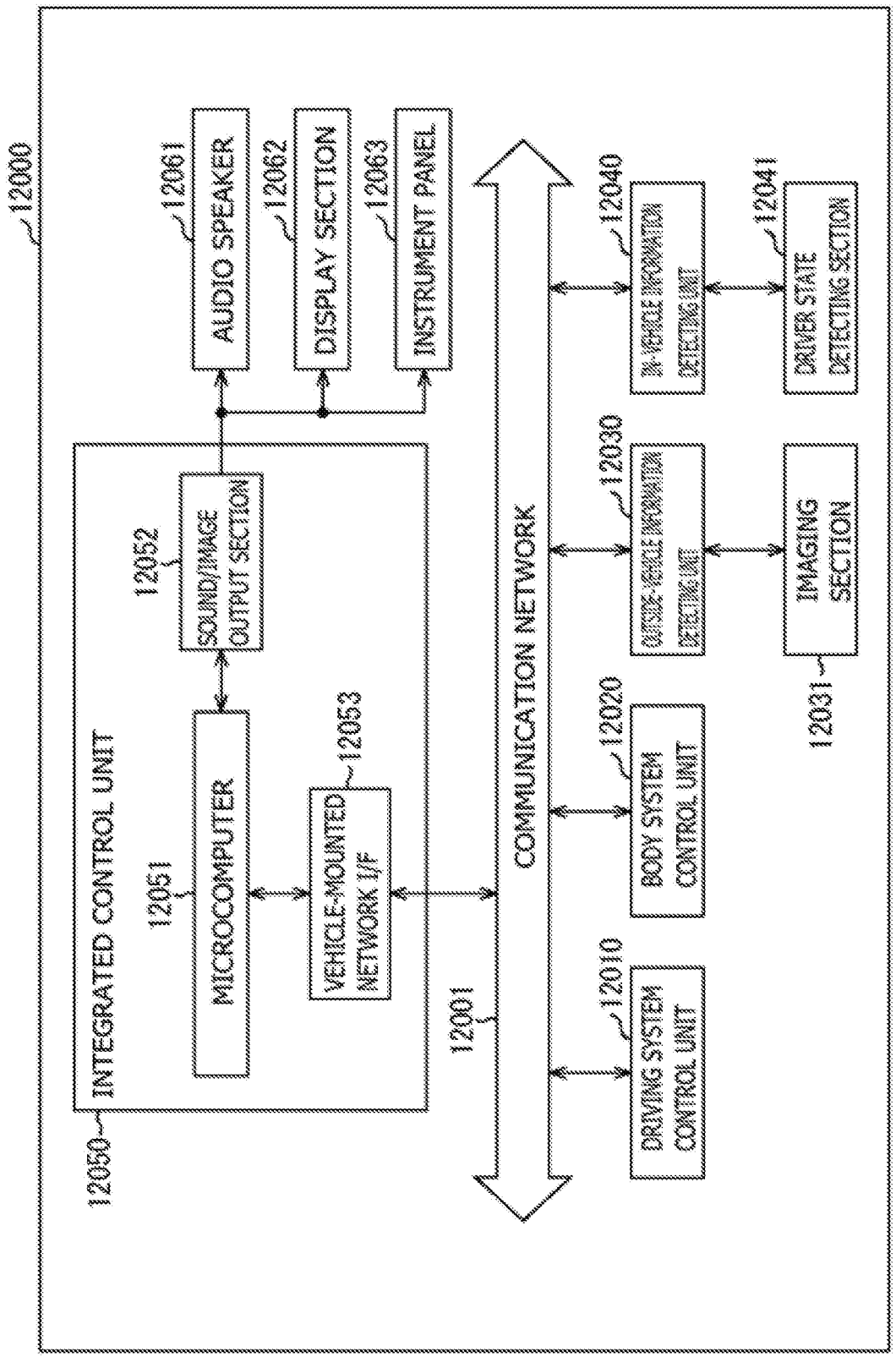
[FIG. 11]

[FIG. 12]
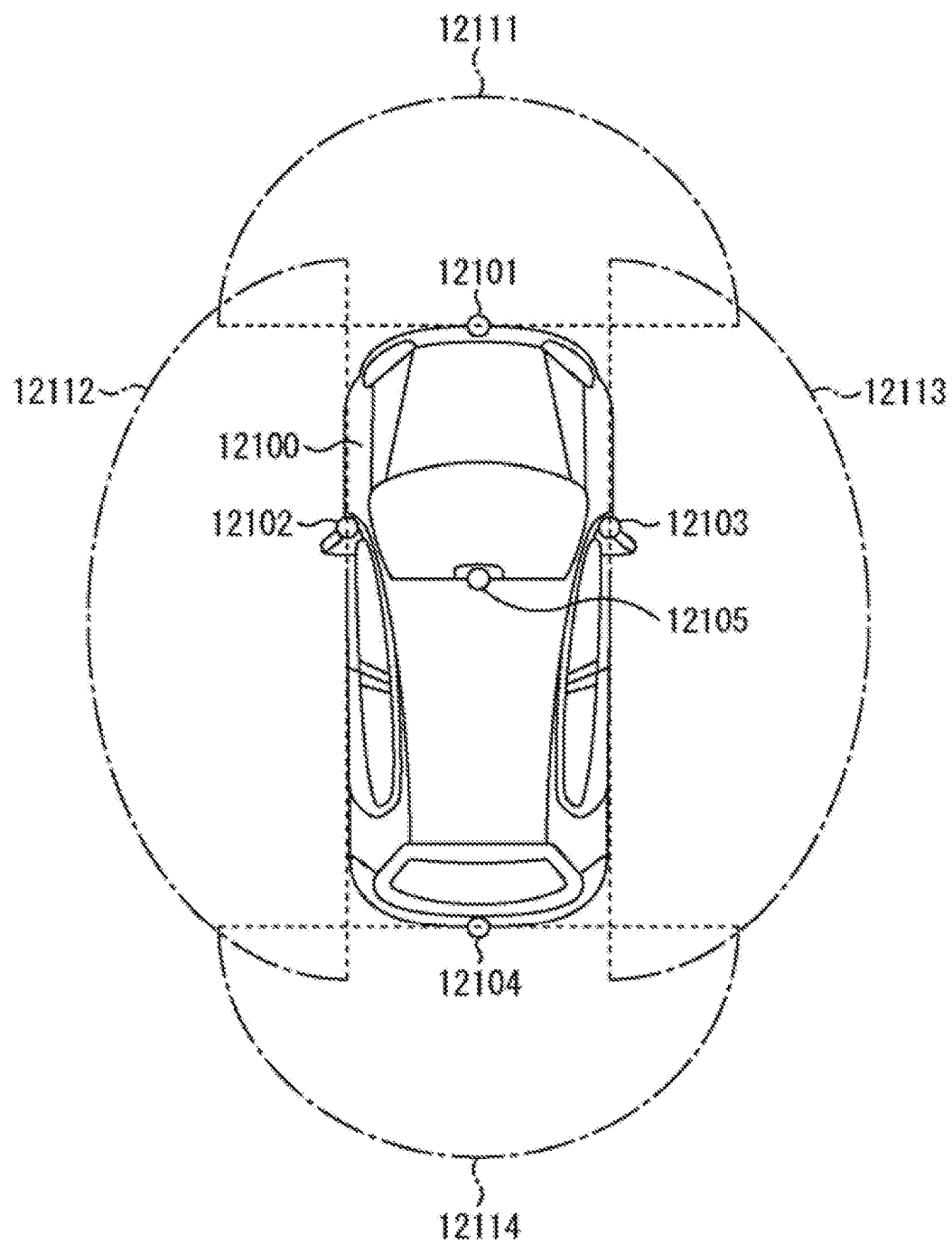

IMAGING DEVICE AND MANUFACTURING METHOD THEREOF

CROSS REFERENCE TO RELATED APPLICATIONS

This application is a U.S. National Phase of International Patent Application No. PCT/JP2019/008598 filed on Mar. 5, 2019, which claims priority benefit of Japanese Patent Application No. JP 2018-058240 filed in the Japan Patent Office on Mar. 26, 2018. Each of the above-referenced applications is hereby incorporated herein by reference in its entirety.

TECHNICAL FIELD

The present technology relates to an imaging device having a global shutter function and a manufacturing method thereof.

BACKGROUND ART

In recent years, a back-illuminated CMOS (Complementary Metal Oxide Semiconductor) image sensor (an imaging device) having a global shutter function has attracted attention (for example, refer to PTL 1). Such an image sensor includes a charge holding section for each pixel. A signal charge transferred from a photoelectric converter is temporarily held by the charge holding section.

For example, the charge holding section is provided by being stacked on a side of the photoelectric converter opposite to a light entrance side of the photoelectric converter.

CITATION LIST

Patent Literature

PTL 1: Japanese Unexamined Patent Application Publication No. 2015-95468

SUMMARY OF THE INVENTION

Regarding such an imaging device, it is desired to prevent leakage of light into a charge accumulator (PLS: Parasitic Light Sensitivity).

Therefore, it is desirable to provide an imaging device that is able to suppress PLS and a manufacturing method thereof.

An imaging device according to one embodiment of the present technology includes a photoelectric converter, a charge holding section that is provided on a side of the photoelectric converter opposite to a light entrance side and holds a signal charge generated by the photoelectric converter, and a light shielding section that has a first light shielding surface extending toward the charge holding section from between the charge holding section and the photoelectric converter.

In the imaging device according to one embodiment of the present technology, the first light shielding surface of the light shielding section extends toward the charge holding section from between the charge holding section and the photoelectric converter. This prevents entry of light into the charge holding section from a direction in which the first light shielding surface is provided. For example, the first light shielding surface is disposed between a transfer path of the signal charge from the photoelectric converter to the charge holding section and the charge holding section.

A manufacturing method of an imaging device according to one embodiment of the present technology includes forming a photoelectric converter, forming a light shielding section that has a first light shielding surface on a side of the photoelectric converter opposite to a light entrance side of the photoelectric converter, and forming a charge holding section electrically coupled to the photoelectric converter, at least a portion of the charge holding section being covered with the first light shielding surface. The first light shielding surface of the light shielding section extending toward the charge holding section from between the photoelectric converter and the charge holding section.

The manufacturing method of the imaging device according to one embodiment of the present technology forms the light shielding section having the first light shielding surface. This prevents entry of light into the charge holding section from a direction in which the first light shielding surface is provided.

According to the imaging device and the manufacturing method of the imaging device of one embodiment of the present technology, the provision of the light shielding section having the first light shielding surface makes it possible to prevent entry of light into the charge holding section from the direction in which the first light shielding surface is provided. Therefore, it is possible to suppress the PLS. Note that the effects described here are not necessarily limitative, and may be any of effects described in the present disclosure.

BRIEF DESCRIPTION OF DRAWING

FIG. 1 is a block diagram illustrating an example of a functional configuration of an imaging device according to one embodiment of the present technology.

FIG. 2 is a diagram illustrating an example of a pixel circuit of the imaging device illustrated in FIG. 1.

FIG. 3 is a cross-sectional schematic diagram illustrating a configuration of a main portion of a pixel array unit illustrated in FIG. 1.

FIG. 4 is a cross-sectional schematic diagram illustrating another example (1) of a configuration of a light shielding section illustrated in FIG. 3.

FIG. 5A is a cross-sectional schematic diagram illustrating still another example (2) of the configuration of the light shielding section illustrated in FIG. 3.

FIG. 5B is a cross-sectional schematic diagram illustrating yet another example (3) of the configuration of the light shielding section illustrated in FIG. 3.

FIG. 5C is a cross-sectional schematic diagram illustrating still yet another example (4) of the configuration of the light shielding section illustrated in FIG. 3.

FIG. 5D is a cross-sectional schematic diagram illustrating still another example (5) of the configuration of the light shielding section illustrated in FIG. 3.

FIG. 6A is a cross-sectional schematic diagram illustrating a process of a manufacturing method of the imaging device illustrated in FIG. 3.

FIG. 6B is a cross-sectional schematic diagram illustrating a process subsequent to FIG. 6A.

FIG. 6C is a cross-sectional schematic diagram illustrating a process subsequent to FIG. 6B.

FIG. 6D is a cross-sectional schematic diagram illustrating a process subsequent to FIG. 6C.

FIG. 6E is a cross-sectional schematic diagram illustrating a process subsequent to FIG. 6D.

FIG. 7A is a cross-sectional schematic diagram illustrating another example (1) of the manufacturing method of the imaging device illustrated in FIG. 3.

FIG. 7B is a cross-sectional schematic diagram illustrating a process subsequent to FIG. 7A.

FIG. 7C is a cross-sectional schematic diagram illustrating a process subsequent to FIG. 7B.

FIG. 7D is a cross-sectional schematic diagram illustrating a process subsequent to FIG. 7C.

FIG. 7E is a cross-sectional schematic diagram illustrating a process subsequent to FIG. 7D.

FIG. 8A is a cross-sectional schematic diagram illustrating still another example (3) of the manufacturing method of the imaging device illustrated in FIG. 3.

FIG. 8B is a cross-sectional schematic diagram illustrating a process subsequent to FIG. 8A.

FIG. 8C is a cross-sectional schematic diagram illustrating a process subsequent to FIG. 8B.

FIG. 8D is a cross-sectional schematic diagram illustrating a process subsequent to FIG. 8C.

FIG. 8E is a cross-sectional schematic diagram illustrating a process subsequent to FIG. 8D.

FIG. 9 is a cross-sectional schematic diagram illustrating a configuration of a main portion of an imaging device according to a comparative example.

FIG. 10 is a functional block diagram illustrating an example of an electronic apparatus (a camera) using the imaging device illustrated in, e.g., FIG. 1.

FIG. 11 is a block diagram depicting an example of schematic configuration of a vehicle control system.

FIG. 12 is a diagram of assistance in explaining an example of installation positions of an outside-vehicle information detecting section and an imaging section.

MODES FOR CARRYING OUT THE INVENTION

Hereinafter, an embodiment of the present technology will be described in detail with reference to the drawings. Note that the description will be made in the following order.
1. Embodiment (Example of Imaging Device Provided with Light Shielding Section Having First Light Shielding Surface)
2. Application Example
3. Example of Application

Embodiment

[Configuration of Imaging Device 1]

FIG. 1 is a block diagram illustrating an example of a functional configuration of an imaging device 1 according to one embodiment of the present technology.

The imaging device 1 is a back-illuminated image sensor of a global shutter system including, for example, a CMOS image sensor or the like. The imaging device 1 captures an image by receiving light from a subject and photoelectrically converting the received light to generate an image signal. Note that the present technology is not limited to an application to a CMOS image sensor. The imaging device 1 may have a structure in which a plurality of semiconductor chips is stacked, or may include a single semiconductor chip.

The global shutter system is a system that performs global exposure in which exposure is started basically at the same time for all pixels and finished at the same time for all the pixels. Here, all the pixels mean all pixels in a portion that appears in an image, and a dummy pixel or the like is excluded. Furthermore, if a time difference or a distortion of an image is sufficiently small so as not to cause a problem, the global shutter system also includes a system that shifts among regions where to perform global exposure while performing global exposure in units of a plurality of rows (for example, several tens of rows), rather than exposing all the pixels at the same time. Furthermore, the global shutter system also includes a system that performs global exposure on pixels in a predetermined region, rather than on all the pixels in the portion that appears in the image.

The imaging device 1 includes a pixel array unit 111, a vertical driver 112, a ramp wave module 113, a clock module 114, a data storage 115, a horizontal driver 116, a system controller 117, and a signal processor 118.

The pixel array unit 111 is provided in a middle portion of the imaging device 1. The pixel array unit 111 includes a plurality of pixels arranged, for example, in a matrix (matrix). Each pixel includes a photoelectric conversion element that generates and accumulates a charge depending on an amount of light entering from the subject. For example, in the pixel array unit 111, a pixel driving line (not illustrated) is wired along a row direction for each pixel row including pixels arranged in the row direction, and a vertical signal line (a vertical signal line VSL in FIG. 2 to be described later) is wired along a column direction for each pixel column including pixels arranged in the column direction.

The vertical driver 112 includes, for example, a shift register, an address decoder, etc. The vertical driver 112 drives all the pixels of the pixel array unit 111 at the same time or drives the pixels in units of, e.g., rows by supplying a signal or the like to the respective pixels via the plurality of pixel driving lines.

The ramp wave module 113 generates a ramp wave signal that is used for A/D (Analog/Digital) conversion of the pixel signal and supplies the generated signal to a column processor (not illustrated). Note that the column processor includes, for example, a shift register, an address decoder, etc. The column processor performs noise removal processing, correlation double sampling processing, A/D conversion processing, etc., and generates a pixel signal. The column processor supplies the generated pixel signal to the signal processor 118.

The clock module 114 supplies a clock signal for an operation to each unit of the imaging device 1.

The horizontal driver 116 sequentially selects a unit circuit corresponding to a pixel column of the column processor. As a result of the selective scanning performed by the horizontal driver 116, the pixel signals having undergone signal processing by the column processor for each unit circuit are sequentially outputted to the signal processor 118.

The system controller 117 includes, e.g., a timing generator that generates various timing signals. The system controller 117 controls driving of the vertical driver 112, the ramp wave module 113, the clock module 114, the horizontal driver 116, and the column processor on the basis of the timing signal generated by the timing generator.

While temporarily storing data in the data storage 115 as necessary, the signal processor 118 performs signal processing such as arithmetic processing on the pixel signal supplied from the column processor and outputs an image signal including each pixel signal.

FIG. 2 illustrates an example of a configuration of a pixel circuit of the imaging device 1. The imaging device 1 includes a PD (photodiode) 11, an MEM (memory) 12, and an FD (floating diffusion) 13 for each pixel. A first transfer transistor (TRX) 21 is provided between the PD 11 and the MEM 12, and a second transfer transistor (TRG) 22 is provided between the MEM 12 and the FD 13. A reset transistor (RST) 23 is coupled along with the second transfer transistor 22 to the FD 13. Furthermore, the FD 13 is coupled to the vertical signal line VSL via an amplification transistor (AMP) 24 and a selection transistor (SEL) 25. A discharge transistor (OFG) 26 is coupled along with the first transfer transistor 21 to the PD 11. The PD 11 is a specific example of a photoelectric converter according to the present disclosure, the MEM 12 is a specific example of a charge holding section according to the present disclosure, and the FD 13 is a specific example of a charge voltage converter according to the present disclosure.

The PD 11, which is provided for each pixel, receives light from the subject and performs photoelectric conversion. The PD 11 generates a signal charge dependent on an amount of light received, and accumulates the generated signal charge.

One of a pair of source and drain electrodes of the first transfer transistor 21 is coupled to the PD 11, and another one is coupled to the MEM 12. The first transfer transistor 21 is turned on when a first transfer signal is inputted to a gate of the first transfer transistor 21. This causes the signal charge generated by the PD 11 to be read and transferred to the MEM 12.

The MEM 12 is coupled to the first transfer transistor 21 and the second transfer transistor 22. The MEM 12 is a charge holding section that temporarily holds the signal charge generated by the PD 11. A global shutter function is realized in the imaging device 1 because of the provision of the MEM 12.

One of a pair of source and drain electrodes of the second transfer transistor 22 is coupled to the MEM 12, and another one is coupled to the FD 13. The second transfer transistor 22 is turned on when a second transfer signal is inputted to a gate of the second transfer transistor 22. This causes the signal charge that is temporarily held by the MEM 12 to be read and transferred to the FD 13.

The second transfer transistor 22, the reset transistor 23, and the amplification transistor 24 are coupled to the FD 13. The FD 13 holds the signal charge read from the MEM 12 and converts the signal charge into a voltage (a potential).

The reset transistor 23 is provided between a supply terminal of a constant voltage source VDD and the FD 13. The reset transistor 23 is turned on when a reset signal is inputted to a gate of the reset transistor 23. This causes the charges accumulated in the FD 13 to be discharged to the constant voltage source VDD to reset a potential of the FD 13.

A gate of the amplification transistor 24 is coupled to the FD 13. One of a pair of source and drain electrodes of the amplification transistor 24 is coupled to the supply terminal of the constant voltage source VDD, and another one is coupled to the vertical signal line VSL via the selection transistor 25. The amplification transistor 24 amplifies the potential of the FD 13, and outputs an amplification signal resulting therefrom to the selection transistor 25 as a pixel signal.

The selection transistor 25 is provided between the amplification transistor 24 and the vertical signal line VSL. The selection transistor 25 is turned on when an address signal is inputted to a gate of the selection transistor 25. This causes the pixel signal amplified by the amplification transistor 24 to be controlled and outputted to the vertical signal line VSL.

The discharge transistor 26 is provided between the supply terminal of the constant voltage source VDD and the PD 11. The discharge transistor 26 is turned on when a discharge signal is inputted to a gate of the discharge transistor 26. This causes unnecessary charges accumulated in the PD 11 to be discharged to the constant voltage source VDD.

FIG. 3 schematically illustrates a cross-sectional configuration of the main portion of the pixel array unit 111. In FIG. 3, a region corresponding to a single pixel of the pixel array unit 111 is illustrated.

The imaging device 1 includes a semiconductor substrate 10 and a multi-layered wiring layer 20 stacked on the semiconductor substrate 10. The semiconductor substrate 10 has a first surface S1 (a front surface) and a second surface S2 (a back surface) opposed to each other. The multi-layered wiring layer 20 is provided on the first surface S1 of the semiconductor substrate 10, and the second surface S2 serves as a light receiving surface. The imaging device 1 is a back-illuminated imaging device.

The first transfer transistor 21 and the second transfer transistor 22 are provided near the first surface S1 of the semiconductor substrate 10. The reset transistor 23, the amplification transistor 24, and the selection transistor 25 (FIG. 2) may be provided near the first surface S1 of the semiconductor substrate 10. For example, a planarization film 31, a color filter 32, and a microlens 33 are provided in this order on the second surface S2 of the semiconductor substrate 10. The PD 11, the MEM 12, and the FD 13 (illustrated in FIG. 4 to be described later) are provided in the semiconductor substrate 10. A light shielding section 14 and an insulation film 15 are provided between the PD 11 and the MEM 12.

The multi-layered wiring layer 20 is provided to face the semiconductor substrate 10 and is in contact with the first surface S1 of the semiconductor substrate 10. The multi-layered wiring layer 20 includes a plurality of wiring lines and an interlayer insulation film 201. The multi-layered wiring layer 20 is provided with, for example, a circuit used to drive each pixel.

The first transfer transistor 21 provided near the first surface S1 of the semiconductor substrate 10 is, for example, a vertical transistor. A gate electrode 21G of the first transfer transistor 21 includes a vertical electrode section 21GV that extends along a thickness direction (a Z direction in FIG. 3) of the semiconductor substrate 10 and a planar electrode section 21GP provided perpendicular to the vertical electrode section 21GV. That is, the gate electrode 21G has a T-like cross-sectional shape. The vertical electrode section 21GV is inserted into the semiconductor substrate 10, and the planar electrode section 21GP is provided on the first surface S1 of the semiconductor substrate 10 (i.e., provided in the multi-layered wiring layer 20).

The second transfer transistor 22 is provided at a position adjacent to the first transfer transistor 21. A gate electrode 22G of the second transfer transistor 22 is provided on the first surface S1 of the semiconductor substrate 10 (i.e., provided in the multi-layered wiring layer 20).

The semiconductor substrate 10 has a stacked configuration including, for example, a semiconductor layer (a semiconductor layer 10A in FIG. 6A to be described later) that forms the second surface S2 and a semiconductor layer (a semiconductor layer 10B in FIG. 6B to be described later) that forms the first surface S1. The two semiconductor layers are formed in a stepwise manner by using, for example, epitaxial growth (described later). For example, the PD 11 is provided in the semiconductor layer 10A, and the MEM 12 and the FD 13 (FIG. 4 to be described later) are provided in the semiconductor layer 10B. The semiconductor substrate 10 includes silicon (Si), for example.

The PD 11 is provided widely across the semiconductor substrate 10 in the thickness direction. The PD 11 is, for example, a photodiode having a p-n junction and includes a p-type impurity region and an n-type impurity region.

The MEM 12 is, for example, an n-type impurity region and is provided at a position facing the gate electrode 22G of the second transfer transistor 22. The MEM 12 is disposed at a position in the semiconductor substrate 10 closer to the first surface S1 than the PD 11. That is, the MEM 12 is disposed on a side of the PD 11 opposite to a light entrance side of the PD 11. The MEM 12 is electrically coupled to the PD 11, and a transfer path of the signal charge from the PD 11 to the MEM 12 is provided in the semiconductor substrate 10. The vertical electrode section 21GV of the first transfer transistor 21 is provided in the transfer path of the signal charge from the PD 11 to the MEM 12. A region where the MEM 12 is formed is smaller than a region where the PD 11 is formed, and the MEM 12 is provided at a position overlapping the PD 11 in a plan view (an XY plane in FIG. 3). In this way, by stacking the MEM 12 on the PD 11, it is possible to increase the sizes of the regions where the MEM 12 is formed and where the PD 11 is formed. Therefore, it is possible to increase an amount of saturation signals.

The FD 13 is, for example, an n-type impurity region and is provided at a position in the semiconductor substrate 10 close to the first surface S1. The FD 13 is disposed, for example, to be adjacent to the MEM 12.

The light shielding section 14 suppresses leakage of light (PLS) into the MEM 12. In the present embodiment, the light shielding section 14 has a first light shielding surface 14A that extends toward the MEM 12 from between the PD 11 and the MEM 12. While a detailed description will be given later, the first light shielding surface 14A makes it possible to prevent the leakage of light from the side of the transfer path of the signal charge from the PD 11 to the MEM 12, that is, from the side of the vertical electrode section 21GV into the MEM 12.

The light shielding section 14 has, for example, a plurality of the first light shielding surfaces 14A, and a single second light shielding surface 14B between the PD 11 and the MEM 12. The plurality of first light shielding surfaces 14A is provided, for example, along a YZ plane and an XZ plane and extends in the Z direction (the thickness direction of the semiconductor substrate 10). One end of each of the plurality of first light shielding surfaces 14A is in contact with the second light shielding surface 14B. Each of the plurality of first light shielding surfaces 14A covers a portion of the MEM 12. The light shielding section 14 is provided, for example, at a position away from the first surface S1 of the semiconductor substrate 10 by a distance of about 0.1 μm to about several μm in the thickness direction.

One of the plurality of first light shielding surfaces 14A is provided between the MEM 12 and the vertical electrode section 21GV and effectively suppresses entry of light into the MEM 12 from the side of the vertical electrode section 21GV. Another end of this first light shielding surface 14A is provided between the second light shielding surface 14B and the first surface S1 of the semiconductor substrate 10. That is, the other end of the first light shielding surface 14A is provided with a gap from the first surface S1 of the semiconductor substrate 10, and the transfer path of the signal charge from the PD 11 to the MEM 12 is disposed in the gap. The plurality of first light shielding surfaces 14A is provided around the MEM 12 in a plan view. One or more of the plurality of first light shielding surfaces 14A (for example, the first light shielding surface 14A on the left side in FIG. 3) may extend to the first surface S1 of the semiconductor substrate 10, and may be exposed at its other end in the first surface S1 of the semiconductor substrate 10. By extending the first light shielding surface(s) 14A to the first surface S1 of the semiconductor substrate 10, it is possible to more effectively prevent the leakage of light into the MEM 12.

FIG. 4 illustrates another example of the configuration of the light shielding section 14. As illustrated, the other ends of all the plurality of first light shielding surfaces 14A may be provided with a gap from the first surface S1 of the semiconductor substrate 10.

The second light shielding surface 14B is provided substantially perpendicular to the plurality of first light shielding surfaces 14A and extends between the PD 11 and the MEM 12 substantially in parallel to the first surface S1 of the semiconductor substrate 10. The second light shielding surface 14B is provided to be opposed to the first surface S1 of the semiconductor substrate 10 with the MEM 12 interposed therebetween. The second light shielding surface 14B prevents entry of light into the MEM 12 from the PD 11 side (the side of the second surface S2 of the semiconductor substrate 10). The second light shielding surface 14B has, for example, a rectangular planar shape. Such a second light shielding surface 14B and the plurality of first light shielding surfaces 14A form, for example, a shape of a substantially rectangular parallelepipedal recess, and the MEM 12 is accommodated in the recess. By providing the second light shielding surface 14B together with the first light shielding surfaces 14A, it is possible to suppress the leakage of light into the MEM 12 from multiple directions. The second light shielding surface 14B may have, for example, a circular or polygonal planar shape, and such a second light shielding surface 14B together with the first light shielding surfaces 14A may form a shape of a cylindrical or polygonal prism-like recess.

FIGS. 5A, 5B, 5C, and 5D illustrate examples of a cross-sectional configuration of the light shielding section 14. As illustrated in FIG. 5A, the light shielding section 14 may be, for example, in the shape of a tapered recess. The recess may have an opening that gradually widens toward the first surface S1 of the semiconductor substrate 10, for example. The first light shielding surfaces 14A of such a light shielding section 14 are provided to be inclined with respect to the second light shielding surface 14B. As illustrated in FIG. 5B, the light shielding section 14 may have no second light shielding surface 14B. This light shielding section 14 has, for example, a triangular cross-sectional shape, and is in the shape of a quadrangular pyramidal recess. The light shielding section 14 may be in the shape of a conical recess. As illustrated in FIG. 5C, the light shielding section 14 may have a third light shielding surface 14C between each of the first light shielding surfaces 14A and the second light shielding surface 14B. As illustrated in FIG. 5D, the second light shielding surface 14B of the light shielding section 14 may be curved. Although not illustrated, the first light shielding surfaces 14A of the light shielding section 14 may be curved.

As a light shielding material included in the light shielding section 14, for example, it is possible to use an insulating material such as silicon oxide (SiO, $SiO_2$, or the like), a metal material, or the like. Examples of the metal material include, Cu (copper), molybdenum (Mo), aluminum (Al), tungsten (W), titanium (Ti), tantalum (Ta), nickel (Ni), chromium (Cr), Jr (iridium), platiniridium, titanium nitride (TiN), etc. In order to enhance light shielding property, it is preferable that the light shielding section 14 include tungsten, titanium, or tantalum, and it is preferable that the light shielding section 14 include tungsten among tungsten, titanium, and tantalum. The thicknesses of the first light shielding surface 14A and the second light shielding surface 14B included in the light shielding section 14 are, for example, about several tens of nm to about several hundreds of nm. The light shielding section 14 may include a light shielding material other than the insulating material and the metal material described above.

A negative potential may be applied to the light shielding section 14. This increases a hole concentration and makes it possible to suppress occurrence of white spots.

The insulation film 15 covers around the light shielding section 14, and the light shielding section 14 is provided in the semiconductor substrate 10 with the insulation film 15 interposed therebetween. The light shielding section 14 is thereby insulated from a semiconductor material (for example, Si) included in the semiconductor substrate 10. The insulation film 15 includes, for example, silicon oxide or the like.

The planarization film 31 covering the second surface S2 of the semiconductor substrate 10 includes, for example, silicon nitride (SiN), silicon oxide (SiO), silicon oxynitride (SiON), or the like. The planarization film 31 may have a single-layer structure or a stacked structure.

The color filter 32 covers the second surface S2 of the semiconductor substrate 10 with the planarization film 31 interposed therebetween. The color filter 32 is, for example, any one of a red (R) filter, a green (G) filter, a blue (B) filter, and a white (W) filter and is provided, for example, for each pixel. The color filters 32 are provided in a regular array of colors (for example, the Bayer array). By providing such color filters 32, it is possible for the imaging device 1 to obtain light receiving data having colors corresponding to the color array.

The microlens 33 on the color filter 32 is provided at a position opposed to the PD 11 of each pixel. Light entering the microlens 33 is collected by the PD 11 for each pixel. A lens system of the microlens 33 is set to a value dependent on the size of the pixel. Examples of a lens material for the microlens 33 include an organic material, a silicon oxide film (SiO), etc.

[Manufacturing Method of Imaging Device 1]

It is possible to manufacture the imaging device 1 in the following manner, for example. FIGS. 6A, 6B, 6C, 6D, and 6E illustrate an example of a manufacturing method of the imaging device 1 in order of processes.

First, as illustrated in FIG. 6A, on the semiconductor layer 10A in which the PD 11 is formed, the semiconductor layer 10B is stacked to form the semiconductor substrate 10. The PD 11 is formed by, for example, ion-implanting a p-type impurity and an n-type impurity to the semiconductor layer 10A. The semiconductor layer 10B is formed by, for example, epitaxially growing silicon on the semiconductor layer 10A.

After forming the semiconductor substrate 10, as illustrated in FIG. 6B, an excavated portion G in the shape of a recess is formed on the first surface S1 side of the semiconductor substrate 10 (the semiconductor layer 10B side). The recess-shaped excavated portion G is formed by, for example, forming a groove in the thickness direction of the semiconductor substrate 10 and thereafter applying heat treatment on the groove and widening the groove in the planar direction of the semiconductor substrate 10.

Subsequently, as illustrated in FIG. 6C, the insulation film 15 and the light shielding section 14 are formed in this order in the excavated portion G. The insulation film 15 is formed by, for example, forming a silicon oxide film in the exca-vated portion G. The light shielding section 14 is formed by, for example, forming a metal film on the insulation film 15.

After the light shielding section 14 is formed in the semiconductor substrate 10, as illustrated in FIGS. 6D and 6E, the MEM 12 and the transfer path of the signal charge from the PD 11 to the MEM 12 are formed. For example, the MEM 12 is formed by ion-implanting the n-type impurity in a region surrounded by the light shielding section 14 in the shape of a recess. The transfer path of the signal charge is formed by, for example, ion-implanting the n-type impurity to couple the MEM 12 and the PD 11 to each other via the gap between the other end of the first light shielding surface 14A and the first surface S1 of the semiconductor substrate 10.

Thereafter, the first transfer transistor 21, the second transfer transistor 22, etc., are formed. Next, the multilayered wiring layer 20 is formed on the first surface S1 of the semiconductor substrate 10. Finally, the planarization film 31, the color filter 32, and the microlens 33 are formed on the second surface S2 of the semiconductor substrate 10 to thereby complete the imaging device 1 illustrated in FIGS. 1 to 3.

The light shielding section 14 may be formed by a method other than the method described above.

FIGS. 7A, 7B, 7C, 7D, and 7E illustrate another example (1) of the method for forming the light shielding section 14.

First, as illustrated in FIG. 7A, the PD 11 is formed in the semiconductor layer 10A. Next, as illustrated in FIG. 7B, the second light shielding surface 14B and one of the first light shielding surfaces 14A (the first light shielding surface 14A on the side of the transfer path of the signal charge) are formed over the semiconductor layer 10A with the insulation film 15 interposed therebetween.

Subsequently, as illustrated in FIG. 7C, the semiconductor layer 10B is formed to cover the first light shielding surface 14A and the second light shielding surface 14B. The semiconductor substrate 10 is thereby formed. Next, as illustrated in FIG. 7D, an excavated portion GA is formed to reach the second light shielding surface 14B from the first surface S1 of the semiconductor substrate 10. Thereafter, the insulation film 15 and the first light shielding surface 14A are formed in the excavated portion GA (FIG. 7E). The light shielding section 14 may be formed in this way.

FIGS. 8A, 8B, 8C, 8D, and 8E illustrate still another example (2) of the method for forming the light shielding section 14.

First, on the semiconductor layer 10A in which the PD 11 is formed, the semiconductor layer 10B is stacked to form the semiconductor substrate 10 (FIG. 6A). Next, as illustrated in FIG. 8A, an opening M having, for example, a depth (the size in the Z direction in FIG. 8A) of about 0.3 μm to about 1.0 μm is formed in the first surface S1 of the semiconductor substrate 10. A planar shape of the opening M is, for example, rectangular.

Subsequently, as illustrated in FIG. 8B, a light shielding material 14M is filled into the opening M with the insulation film 15 interposed therebetween. For example, the insulating material, the metal material, etc. listed as a material configuring the light shielding section 14 described above are usable as the light shielding material 14M.

Next, as illustrated in FIG. 8C, the thickness of the light shielding material 14M is reduced to, for example, about several tens of nm to about several hundreds of nm. The light shielding section 14 is thereby formed. The light shielding section 14 having a predetermined thickness may be formed after forming the opening M in the semiconductor substrate 10 without going through the process illustrated in FIG. 8B.

Subsequently, as illustrated in FIG. 8D, the first light shielding surfaces 14A of the light shielding section 14 are removed by about 0.1 μm to about 0.3 μm from the first surface S1b of the semiconductor substrate 10 to form a gap between the first surface S1 of the semiconductor substrate 10 and the other ends of the first light shielding surfaces 14A. It is sufficient that the gap is provided for at least one of the first light shielding surfaces 14A that is disposed between the vertical electrode section 21GV and the MEM 12.

Next, as illustrated in FIG. 8E, a semiconductor layer 12M is formed on the light shielding section 14 with the insulation film 15 interposed therebetween. The semiconductor layer 12M is formed by, for example, epitaxially growing silicon selectively in the recess of the semiconductor substrate 10 in which the light shielding section 14 is provided. Thereafter, the MEM 12 is formed in the semiconductor layer 12M.

[Operation of Imaging Device 1]

In the imaging device 1, light (for example, light with a wavelength in a visible region) enters the PD 11 via the microlens 33 and the color filter 32. As a result, a pair of a hole and an electron is generated (photoelectrically converted) in the PD 11. When the first transfer signal is inputted to the gate electrode 21G of the first transfer transistor 21 and the first transfer transistor 21 is turned on, the signal charge accumulated in the PD 11 is transferred to the MEM 12. When the second transfer transistor 22 is turned on, the signal charge accumulated in the MEM 12 is transferred to the FD 13. At the FD 13, the signal charge is converted into a voltage signal, and the voltage signal is read as a pixel signal.

[Workings and Effects of Imaging Device 1]

In the imaging device 1 according to the present embodiment, the first light shielding surface 14A of the light shielding section 14 extends toward the MEM 12 from between the MEM 12 and the PD 11. This suppresses the entry of light into the MEM 12 from the direction in which the first light shielding surface 14A is provided. In particular, the first light shielding surface 14A disposed between the vertical electrode section 21GV and the MEM 12 effectively suppresses the entry of light into the MEM 12. These workings and effects will be described below with reference to a comparative example.

FIG. 9 illustrates a schematic cross-sectional configuration of a main portion of an imaging device (an imaging device 100) according to the comparative example. A light shielding section (a light shielding section 104) of the imaging device 100 includes only the second light shielding surface 14B between the PD 11 and the MEM 12. In other words, the light shielding section 104 is provided substantially parallel to the first surface S1 of the semiconductor substrate 10 and does not have any light shielding surface (for example, the first light shielding surface 14A in FIG. 3) that extends in the thickness direction of the semiconductor substrate 10. The light shielding section 104 is provided in a place other than the vicinity of the vertical electrode section 21GV. Therefore, it is difficult for the light shielding section 104 to prevent the leakage of light into the MEM from the direction in which the vertical electrode section 21GV is provided. That is, in the imaging device 100, a false signal can occur due to the leakage of light from this direction.

In contrast, the light shielding section 14 of the imaging device 1 has the first light shielding surface 14A in addition to the second light shielding surface 14B. As described with reference to the imaging device 100, it is difficult to provide the second light shielding surface 14B near the vertical electrode section 21GV. Therefore, by providing the first light shielding surface 14A between the vertical electrode section 21GV and the MEM 12, the leakage of light into the MEM 12 from the direction in which the vertical electrode section 21GV is provided is effectively prevented.

As described above, the imaging device 1 according to the present embodiment is provided with the light shielding section 14 having the first light shielding surface 14A. This makes it possible to prevent the entry of light into the MEM 12 from the direction in which the first light shielding surface 14A is provided. Therefore, it is possible to suppress the PLS.

Furthermore, the light shielding section 14 is preferably in the shape of a recess. By accommodating the MEM 12 in the light shielding section 14 in the shape of a recess, it is possible to more effectively prevent the leakage of light into the MEM 12.

Application Example

The imaging device 1 described above is applicable to various types of electronic apparatuses, such as a camera, for example. FIG. 10 illustrates a schematic configuration of an electronic apparatus 3 (a camera) as an example of various types of electronic apparatuses. The electronic apparatus 3 is, for example, a camera that is able to capture a still image or a moving image. The electronic apparatus 3 includes the imaging device 1, an optical system (an optical lens) 310, a shutter device 311, a driver 313 that drives the imaging device 1 and the shutter device 311, and a signal processor 312.

The optical system 310 guides image light (incident light) from a subject to the imaging device 1. The optical system 310 may include a plurality of optical lenses. The shutter device 311 controls a light irradiation time and a light shielding time for the imaging device 1. The driver 313 controls a transfer operation of the imaging device 1 and a shutter operation of the shutter device 311. The signal processor 312 performs various signal processing on a signal outputted from the imaging device 1. An image signal Dout having undergone the signal processing is stored in a storage medium such as a memory or is outputted to a monitor or the like.

Moreover, the imaging device 1 described in the foregoing embodiment is also applicable to the following electronic apparatus (a mobile body such as a vehicle).

<Example of Application to Mobile Body>

The technology according to the present disclosure is applicable to various products. For example, the technology according to the present disclosure may be implemented as a device mounted on a mobile body of any kind such as an automobile, an electric vehicle, a hybrid electric vehicle, a motorcycle, a bicycle, a personal mobility, an airplane, a drone, a vessel, a robot, a construction machine, and an agricultural machine (tractor).

FIG. 11 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 11, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 11, an audio speaker 12061, a display section 12062, and an instrument panel 12063 are illustrated as the output device. The display section 12062 may, for example, include at least one of an on-board display and a head-up display.

FIG. 12 is a diagram depicting an example of the installation position of the imaging section 12031.

In FIG. 12, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 12 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to the present disclosure is applicable. The technology according to the present disclosure may be applied to the imaging section 12031 of the configurations described above. Applying the technology according to the present disclosure to the imaging section 12031 makes it possible to obtain a captured image which is easier to see. Hence, it is possible to reduce the fatigue of the driver.

While descriptions have been made with reference to the embodiment, the content of the present disclosure is not limited to the foregoing embodiment but may be modified in a variety of ways. For example, the configuration of the imaging device described in the embodiment is an example, and may further include other layers. Furthermore, the material and the thickness of each layer are examples, and are not limited to those described above.

Furthermore, in the embodiment, the manufacturing method of the imaging device 1 has been described using an example. However, the imaging device 1 may be manufactured by using other methods.

Note that the effects described in the embodiment or the like are examples, and may be other effects or may further include other effects.

Note that the present disclosure may have the following configurations.

(1)

An imaging device including:

a photoelectric converter;

a charge holding section that is provided on a side of the photoelectric converter opposite to a light entrance side of the photoelectric converter and holds a signal charge generated by the photoelectric converter; and a light shielding section that includes a first light shielding surface extending toward the charge holding section from between the charge holding section and the photoelectric converter.

(2)

The imaging device according to (1), in which the light shielding section is in a shape of a recess that accommodates the charge holding section.

(3)

The imaging device according to (2), in which the light shielding section has a triangular cross-sectional shape.

(4)

The imaging device according to (2), in which the light shielding section is in the shape of the recess that is tapered.

(5)

The imaging device according to any one of (1) to (4), further including a semiconductor substrate that includes the photoelectric converter, the charge holding section, and the light shielding section, in which the photoelectric converter, the light shielding section, and the charge holding section are provided in this order from a light entrance side of the semiconductor substrate.

(6)

The imaging device according to (5), further including a first transfer transistor that transfers the signal charge from the photoelectric converter to the charge holding section, in which a gate electrode of the first transfer transistor includes a vertical electrode section that extends in a thickness direction of the semiconductor substrate.

(7)

The imaging device according to (6), in which the first light shielding surface is disposed between the vertical electrode section and the charge holding section.

(8)

The imaging device according to (7), in which the light shielding section further includes a second light shielding surface that is provided in parallel to a surface of the semiconductor substrate and between the charge holding section and the photoelectric converter.

(9)

The imaging device according to (8), in which one end of the first light shielding surface is in contact with the second light shielding surface, and another end of the first light shielding surface is provided with a gap from the surface of the semiconductor substrate.

(10)

The imaging device according to any one of (5) to (8), in which the light shielding section includes a plurality of the first light shielding surfaces, and at least one or more of the plurality of first light shielding surfaces is provided to extend to the surface of the semiconductor substrate.

(11)

The imaging device according to any one of (5) to (10), further including an insulation film, in which
  the light shielding section is provided in the semiconductor substrate with the insulation film interposed therebetween.

(12)

The imaging device according to any one of (1) to (11), in which the light shielding section includes silicon oxide or metal.

(13)

The imaging device according to any one of (1) to (12), further including:
  a second transfer transistor; and
  a charge voltage converter to which the signal charge is transferred by the second transfer transistor from the charge holding section.

(14)

A manufacturing method of an imaging device including:
  forming a photoelectric converter;
  forming a light shielding section that has a first light shielding surface on a side of the photoelectric converter opposite to a light entrance side of the photoelectric converter; and
  forming a charge holding section electrically coupled to the photoelectric converter, at least a portion of the charge holding section being covered with the first light shielding surface, in which
  the first light shielding surface of the light shielding section extends toward the charge holding section from between the photoelectric converter and the charge holding section.

The present application claims priority based on Japanese Patent Application No. 2018-58240 filed with the Japan Patent Office on Mar. 26, 2018, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. An imaging device, comprising:
  a photoelectric converter configured to generate a signal charge;
  a charge holding section on a side of the photoelectric converter that is opposite to a light entrance side of the photoelectric converter, wherein the charge holding section is configured to hold the generated signal charge;
  a light shielding section that includes a first light shielding surface between the charge holding section and the photoelectric converter; and
  a vertical electrode section, wherein
    the charge holding section has a specific surface parallel to the vertical electrode section,
    the specific surface of the charge holding section and the vertical electrode section are parallel to a first direction, and
    in a second direction perpendicular to the first direction, the first light shielding surface is between the vertical electrode section and the specific surface of the charge holding section.

2. The imaging device according to claim 1, wherein the light shielding section is in a shape of a recess that accommodates the charge holding section.

3. The imaging device according to claim 2, wherein the light shielding section has a triangular cross-sectional shape.

4. The imaging device according to claim 2, wherein the light shielding section is in the shape of the recess that is tapered.

5. The imaging device according to claim 1, further comprising a semiconductor substrate that includes the photoelectric converter, the charge holding section, and the light shielding section, wherein the photoelectric converter, the light shielding section, and the charge holding section are in this order from a light entrance side of the semiconductor substrate.

6. The imaging device according to claim 5, further comprising a first transfer transistor that transfers the signal charge from the photoelectric converter to the charge holding section, wherein a gate electrode of the first transfer transistor includes the vertical electrode section that extends in a thickness direction of the semiconductor substrate.

7. The imaging device according to claim 5, wherein
  the light shielding section further includes a second light shielding surface that is parallel to a surface of the semiconductor substrate, and
  the second light shielding surface is between the charge holding section and the photoelectric converter.

8. The imaging device according to claim 7, wherein
  a first end of the first light shielding surface is in contact with the second light shielding surface, and
  a second end of the first light shielding surface is at a specific distance from the surface of the semiconductor substrate.

9. The imaging device according to claim 5, wherein
  the light shielding section includes a plurality of first light shielding surfaces,
  the plurality of first light shielding surfaces includes the first light shielding surface, and
  at least one of the plurality of first light shielding surfaces extends to a surface of the semiconductor substrate.

10. The imaging device according to claim 5, further comprising an insulation film between the semiconductor substrate and the light shielding section.

11. The imaging device according to claim 1, wherein the light shielding section includes at least one of a silicon oxide or a metal.

12. The imaging device according to claim 1, further comprising:
   a second transfer transistor; and
   a charge voltage converter, wherein the signal charge is transferred by the second transfer transistor from the charge holding section to the charge voltage converter.

* * * * *